(12) United States Patent
Harris et al.

(10) Patent No.: US 8,097,340 B2
(45) Date of Patent: Jan. 17, 2012

(54) COATED SUBSTRATES HAVING UNDERCOATING LAYERS THAT EXHIBIT IMPROVED PHOTOCATALYTIC ACTIVITY

(75) Inventors: Caroline S. Harris, Pittsburgh, PA (US); Cheri M. Boykin, Wexford, PA (US); Songwei Lu, Wexford, PA (US); Scott D. Walck, Oceanside, CA (US)

(73) Assignee: PPG Industries Ohio, Inc., Cleveland, OH (US)

( * ) Notice: Subject to any disclaimer, the term of this patent is extended or adjusted under 35 U.S.C. 154(b) by 495 days.

(21) Appl. No.: 11/349,657

(22) Filed: Feb. 8, 2006

(65) Prior Publication Data
US 2007/0184291 A1    Aug. 9, 2007

(51) Int. Cl.
*B32B 17/06* (2006.01)
(52) U.S. Cl. ........................................ 428/428; 428/432
(58) Field of Classification Search .................. 428/325, 428/432, 469, 472, 701, 702; 427/226, 255, 427/374, 424
See application file for complete search history.

(56) References Cited

U.S. PATENT DOCUMENTS

| | | | |
|---|---|---|---|
| 3,083,551 A | 4/1963 | Pilkington | |
| 3,220,816 A | 11/1965 | Pilkington | |
| 3,660,061 A | 5/1972 | Donley et al. | |
| 3,843,346 A | 10/1974 | Edge et al. | |
| 4,093,438 A * | 6/1978 | Currie | 65/62 |
| 4,111,150 A | 9/1978 | Donley et al. | |
| 4,187,336 A | 2/1980 | Gordon | 428/34 |
| 4,379,040 A | 4/1983 | Gillery | |
| 4,719,126 A | 1/1988 | Henery | |
| 4,719,127 A | 1/1988 | Greenberg | |
| 4,853,257 A | 8/1989 | Henery | |
| 4,861,669 A | 8/1989 | Gillery | |
| 4,900,633 A | 2/1990 | Gillery | |
| 4,971,843 A | 11/1990 | Michelotti et al. | |
| 5,464,657 A | 11/1995 | Athey et al. | |
| 5,599,387 A | 2/1997 | Neuman et al. | |
| 5,948,131 A | 9/1999 | Neuman | |
| 6,013,372 A | 1/2000 | Hayakawa et al. | |
| 6,071,623 A * | 6/2000 | Sugawara et al. | 428/428 |
| 6,103,363 A | 8/2000 | Boire et al. | |
| 6,379,776 B1 * | 4/2002 | Tada et al. | 428/149 |
| 6,413,581 B1 * | 7/2002 | Greenberg et al. | 427/226 |
| 6,607,999 B2 * | 8/2003 | Hachitani | 501/69 |
| 6,737,145 B1 * | 5/2004 | Watanabe et al. | 428/64.4 |
| 2003/0082367 A1 * | 5/2003 | Talpaert et al. | 428/328 |
| 2003/0224181 A1 * | 12/2003 | Finley et al. | 428/432 |
| 2005/0137084 A1 | 6/2005 | Krisko et al. | 502/349 |
| 2006/0029813 A1 | 2/2006 | Kutilek et al. | 428/426 |
| 2007/0148064 A1 | 6/2007 | Labrousse | 422/211 |

FOREIGN PATENT DOCUMENTS

| | | |
|---|---|---|
| EP | 0 882 686 | 12/1998 |
| EP | 1 466 665 | 10/2004 |
| EP | 1 637 225 | 3/2006 |
| EP | 1 640 149 | 3/2006 |
| FR | 2 861 386 | 4/2005 |
| GB | 2 334 263 | 8/1999 |
| WO | WO2005/063646 A1 | 7/2005 |
| WO | 2005/110599 | 11/2005 |

* cited by examiner

*Primary Examiner* — Timothy Speer
(74) *Attorney, Agent, or Firm* — Andrew C. Siminerio

(57) ABSTRACT

A coated substrate is disclosed. The coated substrate includes a substrate; an undercoating layer comprising at least one layer selected from a mixture of silica and zirconia; a mixture of silica and alumina; or a mixture of silica, alumina and titania overlaying at least a portion of the substrate; and a functional coating overlaying at least a portion of the undercoating. The coated substrates of the invention exhibit improved properties such as increased durability, photocatalytic activity, etc. as a result of the undercoating layer.

14 Claims, No Drawings

COATED SUBSTRATES HAVING UNDERCOATING LAYERS THAT EXHIBIT IMPROVED PHOTOCATALYTIC ACTIVITY

BACKGROUND

Substrates such as glass and steel are used to make buildings, appliances, cars, etc. Oftentimes, it is necessary to apply a functional coating(s) over the substrate to achieve certain performance properties. Examples of functional coatings are electroconductive coatings, photocatalytic coatings, low emissivity coatings, hydrophilic coatings, hydrophobic coatings, anti-reflective coatings, etc.

The functional coating is typically deposited directly on the substrate. Sometimes, when the functional coating is deposited directly on the substrate, the coated substrate does not achieve all of the desired performance properties (i.e., the required durability, the required aesthetic properties, etc.). For example, a coated substrate having a functional coating applied directly on the substrate may fail to exhibit a desired level of photocatalytic activity (PCA). Sometimes, a coated substrate is desirable that exhibits a higher PCA in certain environments such as environments where there is heavy soiling and/or low exposure to UV light.

The present invention provides coated substrates that include specific undercoating layers which have been found to enable the coated substrates to exhibit higher levels of photocatalytic activity than the same coated substrate would exhibit without the undercoating layer. The coated substrates, which include an undercoating layer exhibit, 1.5 to 2 times the photocatalytic activity of the same coated substrate without the undercoating. The undercoating layer can also be manipulated to provide a coated substrate with the desired aesthetic properties, for example, a neutral colored appearance.

SUMMARY OF THE INVENTION

In a non-limiting embodiment, the present invention is a coated substrate comprising a substrate; an undercoating layer comprising at least one layer selected from a mixture of silica and zirconia; a mixture of silica and alumina; or a mixture of silica, alumina and titania overlaying at least a portion of the substrate; and a functional coating overlaying at least a portion of the undercoating layer.

In another non-limiting embodiment, the present invention is a method for making a coated substrate comprising depositing an undercoating comprising at least one layer selected from a mixture of silica and zirconia; a mixture of silica and alumina; or a mixture of silica, alumina and titania on at least a portion of a substrate; and depositing a photocatalytic coating on at least a portion of the undercoating layer.

BRIEF DESCRIPTION OF THE INVENTION

All numbers expressing dimensions, physical characteristics, quantities of ingredients, reaction conditions, and the like used in the specification and claims are to be understood as being modified in all instances by the term "about". Accordingly, unless indicated to the contrary, the numerical values set forth in the following specification and claims may vary depending upon the desired properties sought to be obtained by the present invention. At the very least, and not as an attempt to limit the application of the doctrine of equivalents to the scope of the claims, each numerical parameter should at least be construed in light of the number of reported significant digits and by applying ordinary rounding techniques. Moreover, all ranges disclosed herein are to be understood to encompass any and all subranges subsumed therein. For example, a stated range of "1 to 10" should be considered to include any and all subranges between (and inclusive of) the minimum value of 1 and the maximum value of 10; that is, all subranges beginning with a minimum value of 1 or more and ending with a maximum value of 10 or less, e.g., 1.0 to 7.8, 3.0 to 4.5, and 6.3 to 10.0.

As used herein, spatial or directional terms, such as "left", "right", "inner", "outer", "above", "below", "top", "bottom", and the like, are understood to encompass various alternative orientations and, accordingly, such terms are not to be considered as limiting.

As used herein, the terms "on", "applied on/over", "formed on/over", "deposited on/over", "overlay" and "provided on/over" mean formed, deposited, or provided on but not necessarily in contact with the surface. For example, a coating layer "formed over" a substrate does not preclude the presence of one or more other coating layers of the same or different composition located between the formed coating layer and the substrate. For instance, the substrate can include a conventional coating such as those known in the art for coating substrates, such as glass or ceramic.

In a non-limiting embodiment, the present invention is a substrate coated with an undercoating layer comprising a single layer of (1) a mixture of silica and zirconia; (2) a mixture of silica and alumina; or (3) a mixture of silica, alumina and titania and a functional coating over the undercoating layer. The undercoating layer overlays at least a portion of the substrate and can comprise a single layer of coating or multiple layers of coating.

In a non-limiting embodiment of the invention, the undercoating layer comprises a single layer of coating comprising a mixture of silica and zirconia. According to the present invention, the mixture includes at least 45 volume % silica. In a non-limiting embodiment, the mixture comprises 60 to 95 volume % silica and 40 to 5 volume % zirconia. For example, the mixture can comprise 70 to 94 volume % silica and 30 to 6 volume % zirconia, or 80 to 90 volume % silica and 20 to 10 volume % zirconia.

Zirconia is included in the mixture because zirconia precursor to act as a deposition catalyst for the silica precursor during an on-line deposition process. Typical silica precursors do not deposit at an acceptable rate on their own; especially by chemical vapor deposition (CVD). The zirconia in the coating may also contribute barrier properties (i.e., prevents substances such as alkali ions from diffusing from a substrate, such as glass, into coating layers deposited above the undercoating layer) to the undercoating layer.

In the embodiment where the undercoating layer comprises a mixture of silica and zirconia, the thickness of the undercoating layer ranges from 1 nm to 300 nm, for example, from 10 nm to 150 nm, or from 50 nm to 70 nm.

According to the present invention, the undercoating layer comprising a mixture of silica and zirconia can be used along with other undercoating layers described in the specification.

As discussed herein, a mixture that makes up the undercoating layer can be homogeneous throughout, vary randomly throughout the layer, or have a graded progression. For example, the mixture can have a composition that varies in a graded progression between interfaces such as, for example, a substrate and a functional coating. As used herein "graded progression", means that the volume % of the constituent of the undercoating layer changes through its thickness. For example and without limiting the present invention, in an undercoating composition having two constituents, the composition of the undercoating adjacent to the substrate is composed primarily of or exclusively of a first material and as the distance from the substrate increases, the concentration of the first material in the undercoating decreases and the concentration of a second material in the undercoating increases. At a certain distance from the substrate, the composition of the undercoating can be predominantly or exclusively comprised of the second material. As another example, the graded progression can be a step-wise variation or a graded progression in which the concentration of the materials peak and drop off one or more times within the undercoating.

In a non-limiting embodiment of the invention, the change in the concentration of the materials in the mixture is linear.

In another non-limiting embodiment of the invention, the undercoating layer comprises a single layer of coating comprising a mixture of silica and alumina. According to the present invention, the mixture includes at least 50 volume % silica. In a non-limiting embodiment, the mixture comprises 50 to 99 volume % silica and 50 to 1 volume % alumina. For example, the mixture can comprise 60 to 98 volume % silica and 40 to 2 volume % alumina, or 70 to 95 volume % silica and 30 to 5 volume % alumina.

Alumina is in the mixture because alumina precursor to act as a deposition catalyst for the silica precursor during an on-line deposition process. Typical silica precursors do not deposit at an acceptable rate on their own; especially by CVD. The alumina in the coating may also contribute barrier properties to the undercoating layer.

In the embodiment where the undercoating comprises a mixture of silica and alumina, the thickness of the undercoating layer ranges from 1 nm to 300 nm, for example, from 10 nm to 150 nm, or from 60 nm to 80 nm.

According to the present invention, the undercoating layer comprising a mixture of silica and alumina can be used along with other undercoating layers described in the specification.

In another non-limiting embodiment of the invention, the undercoating layer comprises a single layer of coating comprising a mixture of silica, alumina and titania. According to the present invention, the mixture includes at least 30 volume % silica. In a non-limiting embodiment, the mixture comprises 30 to 80 volume % silica, 1 to 15 volume % alumina and 69 to 5 volume % titania, for example 35 to 80 volume % silica, 3 to 15 volume % alumina and 62 to 15 volume % titania.

Titania and alumina are included in the mixture because their precursors act as accelerants for the silica precursor. The alumina in the coating may also contribute barrier properties to the undercoating layer. The titania in the coating can also contribute to the optical performance of the coated substrate.

In the embodiment where the undercoating comprises a mixture of silica, alumina and titania, the thickness of the undercoating layer ranges from 1 nm to 300 nm, for example, from 10 nm to 150 nm, or from 60 nm to 80 nm.

According to the present invention, the undercoating layer comprising a mixture of silica, alumina and titania can be used along with other undercoating layers described in the specification In a non-limiting embodiment of the invention, the undercoating layer is primarily (i.e., greater than or equal to 50 volume %) amorphous as measured using a standard XRD technique. For example, the undercoating layer can be greater than or equal to 70 volume % amorphous or greater than or equal to 90 volume % amorphous.

According to the present invention, the undercoating layer can be applied using conventional application techniques such as CVD, spray pyrolysis, atmospheric plasma deposition and magnetron sputtered vacuum deposition ("MSVD") as are well known in the art.

Suitable CVD methods of deposition are described in the following references which are hereby incorporated by reference: U.S. Pat. Nos. 4,853,257; 4,971,843; 5,464,657; 5,599,387; and 5,948,131. Typical, non-limiting precursors for materials described above in a CVD deposition are as follows:

1. For silica, a suitable precursor is tetraethylorthosilicate (TEOS);
2. For zirconia, suitable precursors are zirconium (IV) t-butoxide (ZTB) and zirconium (IV) t-pentyloxide (ZTP);
3. For alumina, a suitable precursor is aluminum tri-sec-butoxide (ATSB); and
4. For titania, a suitable precursor is tetraisopropyltitanate (TPT).

As is well known in the art, the mixtures described above that make up the undercoating layer can be deposited in different ways. In one non-limiting embodiment of the invention, the precursors are vaporized separately and then mixed. In another non-limiting embodiment, the precursors are mixed and then vaporized.

Suitable spray pyrolysis methods of deposition are described in the following references which are hereby incorporated by reference: U.S. Pat. Nos. 4,719,126; 4,719,127; 4,111,150; and 3,660,061.

Suitable MSVD methods of deposition are described in the following references which are hereby incorporated by reference: U.S. Pat. Nos. 4,379,040; 4,861,669; and 4,900,633.

According to the present invention, a functional coating overlays at least a portion of the undercoating layer. As used herein, the term "functional coating" refers to a coating that modifies one or more physical properties of the substrate over which it is deposited, e.g., optical, thermal, chemical or mechanical properties, and is not intended to be entirely removed from the substrate during subsequent processing. The functional coating can be any type known in the art. The functional coating can be a single layer coating or a multiple layer coating. The functional coating can have one or more layers of coating having the same or different composition or functionality.

In a non-limiting embodiment of the invention, the functional coating is a photocatalytic coating like the one described in U.S. Pat. No. 6,413,581, which is hereby incorporated by reference. The photocatalytic coating is deposited on a substrate so that the substrate can be cleaned relatively easily and/or infrequently. The photocatalytic coating can be any material that can be activated using radiation to have catalytic activity. Examples of suitable photocatalytic coatings include, but are not limited to, one or more metal oxides. A non-limiting list of suitable metal oxides includes titanium oxide, tungsten oxide, zinc oxide, tin oxide, strontium titanate and mixtures thereof. The metal oxide(s) can include superoxides or sub-oxides of the metal. Titania in its various crystal forms, such as anatase form, can be used in the photocatalytic coating.

Non-limiting examples of photocatalytic functional coatings that can be used in the present invention are commercially available from PPG Industries, Inc. of Pittsburgh, Pa. under the SunClean® family of coatings.

Typically, a photocatalytic functional coating is activated using radiation in the ultraviolet range, e.g. 220-400 nm of the electromagnetic spectrum. Suitable sources of ultraviolet radiation include natural sources like solar radiation and artificial sources like black light or an ultraviolet light source.

According to the present invention, the functional coating can be deposited over the undercoating layer using any of the conventional methods described above in reference to the undercoating layer. One skilled in the art knows which deposition techniques can be used based on the type of functional coating and the type of undercoating layer in the desired embodiment.

In a non-limiting embodiment of the present invention, the thickness of the functional coating is at least 10 nm, for example, from 10 nm to 240 nm, or from 30 nm to 215 nm, or from 60 nm to 210 nm.

Suitable substrates for use in the present invention include, but are not limited to, glass, ceramic, etc. Glass used in the present invention can be made via conventional float glass processes. Suitable float processes are described in U.S. Pat. Nos. 3,083,551; 3,220,816; and 3,843,346, which are hereby incorporated by reference.

In a non-limiting embodiment of the invention, the substrate is a glass float ribbon and the undercoating layer and the functional coating are applied during the glass manufacturing process.

In another non-limiting embodiment of the invention, the substrate is a glass float ribbon and the undercoating layer and the functional coating are applied off-line (i.e., after the glass manufacturing process). The off-line coating process can include physical vapor deposition, e.g. sputter deposition, or chemical vapor deposition, e.g. thermal or plasma assisted chemical vapor deposition.

In another non-limiting embodiment of the invention, the substrate is a glass float ribbon and the undercoating layer is applied on-line in the bath section or on-line out of the bath during the glass manufacturing process and the functional coating is applied off-line.

In a non-limiting embodiment of the invention, the undercoating layer exhibits barrier properties. Barrier properties are important when a photocatalytic functional coating like titania overlays an undercoating layer that overlays a substrate such as glass which includes alkali ions. If the undercoating layer does not exhibit sufficient barrier properties, the alkali ions diffuse from the substrate and reduce the photocatalytic activity of coating. It is not known exactly how the alkali ions interact with the photocatalytic coating to reduce photocatalytic activity, but it has been proposed that alkali ions may either be providing recombination sites for the electron-hole pairs and/or negatively affecting the crystal growth of the photocatalytic material during deposition. Alkali ions can also adversely impact the durability of coatings on glass in the presence of moisture. In the presence of water, alkali ions raise the pH of the water to a level that is corrosive to the glass silica network, resulting in a failure at the interface between the coating and the glass surface.

In certain applications, the reflected color of the coated substrate of the present invention as viewed from the coated side is important. In a non-limiting embodiment of the invention, the coated substrate exhibits the following reflected color coordinates as defined by CIE 1967 chromaticity coordinates when measured from the coated side: a* ranging from −20 to 20; b* ranging from −20 to 20; and L* ranging from 40 to 60, for example, a* ranging from −10 to 0; b* ranging from −15 to 0; and L* ranging from 44 to 54.

The present invention includes methods for making the coated substrate of the present invention as well as a method for improving the PCA exhibited by a substrate. For example, the present invention encompasses a method of making a coated substrate comprising depositing an undercoating layer over at least a portion of the substrate and depositing a functional coating over at least a portion of the undercoating. The method of the present invention can also include other processing steps such as annealing or tempering. Such steps are well known in the glass processing art.

The present invention provides coated substrates that exhibit improved performance properties, such as, improved durability, increased photocatalytic activity, etc. Coated substrates according to the present invention can be used to make buildings, vehicles, furniture and appliances. The coated substrates of the invention can be included in laminated and monolithic configurations as well as in insulating structures, e.g. multiple insulating glazing units.

EXAMPLES

The following non-limiting examples are included to illustrate the present invention. Examples 1 through 3 were prepared in the manner described below.

Examples 1 and 2 are of a clear, glass substrate coated with an undercoating layer comprising a mixture of alumina and silica and a titania functional coating over the undercoating layer. Examples 1 and 2 were made in the following manner: a clear, glass substrate measuring 5.5 inches wide by 36 inches long by 0.13 inches thick (13.5 cm wide by 88.2 cm long by 0.32 cm thick) was passed under a chemical vapor deposition (CVD) coater. The CVD coater furnace had three zones including a preheat zone, a coating zone and an annealing zone. The glass substrate was moved through the three zones on an endless conveyor.

The precursors used to deposit the alumina-silica undercoatings on the substrates were tetraethylorthosilicate (TEOS) for silica and aluminum tri-sec-butoxide (ATSB) for alumina. The precursors were evaporated at a temperature of 350° F. (177° C.) at the volume percentages of the total flow and molar ratios shown in Table 1. The total flow includes both precursor compositions and carrier gas ($N_2$), which constitutes most of the total flow. The total flow of the chemical vapor through the CVD coater was 35 standard liters per minute (slm). The line speed of the conveyor was about 50 inches (127 cm) per minute, and the coating slot width was about 0.04 to 0.10 inches (0.10 to 0.25 cm).

The substrate was preheated in the preheat zone to an equilibrium temperature of 1200° F. (649° C.) and then advanced into the coating zone, where the temperature was 1030° F. (554° C.) while under the coater. The coated substrate was then advanced to the annealing zone, where it was annealed from an initial temperature of 1020° F. (549° C.) to a final temperature of 250° F. (121° C.) over a period of 26 minutes.

The coated substrates were then reheated and coated with titania. The precursor used was titanium(IV) isopropoxide (TPT). The titania precursor was deposited in the same manner as the alumina silica undercoating described above. The volume percentages for the total flow of TPT in the vapor phase are shown in Table 1.

Example 3 was coated in a manner similar to Examples 1 and 2 except the titania precursor was deposited directly on an uncoated, clear, glass substrate.

TABLE 1

| Deposition Parameters for Examples 1-3 | | | |
|---|---|---|---|
| | Ex. 1 | Ex. 2 | Ex. 3 |
| molar ratio of TEOS:ATSB in the total flow for the undercoating layer | 4:1 | 2:1 | N/A |
| volume % TEOS in the total flow for the undercoating layer | 0.82 | 0.82 | N/A |
| volume % ATSB in the total flow for the undercoating layer | 0.21 | 0.41 | N/A |

TABLE 1-continued

Deposition Parameters for Examples 1-3

|  | Ex. 1 | Ex. 2 | Ex. 3 |
|---|---|---|---|
| volume % TPT in the total flow for the functional coating | 0.17 | 0.17 | 0.17 |

The amount of alumina and titania and the thickness of the undercoating layers and the functional layers of Examples 1-3 are shown in Table. 2. The amount of alumina and titania in the coating stacks (undercoating layer and functional coating) were determined by X-ray fluorescence and is shown in Table 2. The thickness of the undercoating layer was calculated based on optical data using TFCalc® Software made by Software Spectra, Inc. (Portland, Oreg.). The thickness of the titania functional coating was determined by generating a calibration curve of film thickness as a function of titanium concentration. This calibration curve was then used to estimate the thicknesses of the titania layer.

TABLE 2

Coating Layer Composition and Thickness Data for Examples 1-3

|  | Ex. 1 | Ex. 2 | Ex. 3 |
|---|---|---|---|
| Alumina [micrograms/cm$^2$] | 1.94 | 6.37 | N/A |
| Titania [micrograms/cm$^2$] | 18.67 | 19.63 | 18.91 |
| Thickness of the undercoating layer [nm] | 104 | 337 | N/A |
| Thickness of the titania functional coating [nm] | 81 | 85 | 82 |

The prepared examples were subjected to a stearic acid test described below to determine the relative rate of photocatalytic activity of the coated substrates. The stearic acid test was conducted in the following manner: A stearic acid film formed from a solution of stearic acid in methanol having a concentration of $2.45 \times 10^{-2}$ moles of stearic acid per liter of methanol was deposited over the exemplary coated substrates by pipetting the stearic acid solution at a rate of 2 milliliters per 10 seconds over the center of a sample measuring 1.38 inch (3.5 cm) by 2 inches (5 cm) while the substrate was spinning at a rate of about 1000 revolutions per minutes. The stearic acid flowed across the surface of the substrate by centrifugal force to provide a stearic acid film of having a uniform thickness on the surface of the substrate.

The substrate with the stearic acid overcoat was then exposed to ultraviolet radiation from a UVA-340 light source normal to coating side of the substrate, providing an intensity of 28 W/m$^2$ at the coating surface to induce photocatalytically-activated self-cleaning of the stearic acid film. Periodic Fourier Transform Infrared (FTIR) spectrophotometer measurements were made during the ultraviolet light exposure period using an FTIR spectrophotometer equipped with a mercury cadmium telluride (MCT) detector to quantitatively measure the photocatalytic degradation rate of the stearic acid. More particularly, the stearic acid coated substrate was exposed to ultraviolet radiation for a measured period of time, after which the substrate was placed in the FTIR spectrophotometer, where the integrated area under the C—H absorption band of stearic acid was measured to determine the relative amount of stearic acid present. The substrate was again exposed to ultraviolet radiation for an additional measured period of time to remove additional stearic acid, after which another FTIR measurement was made. This process was repeated, and a plot of the integrated IR absorption intensity of the C—H stretching vibrations versus cumulated time of exposure to ultraviolet light was obtained, the slope of which provided the stearic acid degradation rate which indicates the level of photocatalytic activity of the example (PCA).

All FTIR measurements were taken over the same area of coated substrate in order to minimize the affect of variations in the thickness of the stearic acid test film as described above.

The photocatalytic activity of the coated substrates of Examples 1-3 as calculated using the stearic acid test are shown in Table 3.

TABLE 3

Results of the Stearic Acid Tests for Examples 1-3

|  | PCA ($\times 10^{-3}$ cm$^{-1}$ min$^{-1}$) |
|---|---|
| Ex. 1 | 128 |
| Ex. 2 | 87 |
| Ex. 3 | 43 |

Examples 4-7 are of a clear, glass substrate coated with an undercoating layer comprising a mixture of zirconia and silica and a titania functional coating over the undercoating layer. Examples 4-7 were made using the same deposition method and conditions described above with the following modifications: instead of using a two step process to the deposit the undercoating layer and the titania functional coating, the coating (undercoating and functional coating) of these examples were prepared in one step. While in the coating zone, two slots were employed. The first slot delivered the silica and zirconia precursors, while the second slot delivered the titania precursor. The slots were approximately 10.5 inches (26.67 cm) apart so that distinct layers could be deposited. The precursors used to deposit the silica-zirconia undercoating were tetraethylorthosilicate (TEOS) for silica and zirconium t-butoxide (ZTB) or zirconium (IV) t-pentyloxide (ZTP) for zirconia. The precursors were evaporated at a temperature of 350° F. (177° C.) at the volume percentages of the total flow and molar ratios shown in Table 4.

While the glass substrate was moving under the CVD coater at a speed of 50 inches/min, the titania functional coating was deposited simultaneously with the undercoating layer using the precursor titanium(IV) isopropoxide (TPT), evaporated at a temperature of 350° F. (177° C.), through the second slot at a temperature of 350° F. (177° C.) at the volume percentages of the total flow shown in Table 4.

Example 8 was made in a manner similar to Examples 4-7. In Example 8, a titania coating was deposited directly on an uncoated, clear, glass substrate.

TABLE 4

Deposition Parameters for Examples 4-8

|  | Ex. 4 | Ex. 5 | Ex. 6 | Ex. 7 | Ex. 8 |
|---|---|---|---|---|---|
| molar ratio of TEOS:zirconia precursor | 8 | 8 | 16 | 20 | N/A |
| zirconia precursor | ZTB | ZTP | ZTP | ZTP | N/A |
| volume % TEOS of the total flow for the undercoating layer | 0.240 | 0.240 | 0.480 | 0.600 | N/A |
| volume % zirconia | 0.030 | 0.030 | 0.030 | 0.030 | N/A |

TABLE 4-continued

Deposition Parameters for Examples 4-8

|  | Ex. 4 | Ex. 5 | Ex. 6 | Ex. 7 | Ex. 8 |
|---|---|---|---|---|---|
| precursor of the total flow for the undercoating layer |  |  |  |  |  |
| volume % TPT of the total flow for the functional coating | 0.276 | 0.276 | 0.257 | 0.257 | 0.276 |

The material concentrations and thickness of the undercoating layers and functional layers of Examples 4-8 are shown in Table 5 and were determined in the same manner as discussed earlier for Examples 1-3.

TABLE 5

Coating Layer Composition and Thickness Data for Examples 4-8

|  | Ex. 4 | Ex. 5 | Ex. 6 | Ex. 7 | Ex. 8 |
|---|---|---|---|---|---|
| Zirconia [micrograms/cm$^2$] | 4.1 | 2.4 | 1.1 | 1.0 | N/A |
| Titania [micrograms/cm$^2$] | 32.0 | 29.6 | 29.1 | 28.1 | 30.5 |
| Thickness of the undercoating layer [nm] | 30 | 20 | 72 | 73 | 0 |
| Thickness of the titania functional coating [nm] | 136 | 126 | 124 | 120 | 155 |

The prepared examples were subjected to the stearic acid test as described above. The photocatalytic activity of the coated substrates of Examples 4-8 as calculated using the stearic acid test are shown in Table 6.

TABLE 6

Results of the Stearic Acid Test for Examples 4-8

|  | PCA (×10$^{-3}$ cm$^{-1}$ min$^{-1}$) |
|---|---|
| Ex. 4 | 106 |
| Ex. 5 | 94 |
| Ex. 6 | 96 |
| Ex. 7 | 88 |
| Ex. 8 | 66 |

Examples 9-11 are of a clear, glass substrate coated with an undercoating layer comprising a mixture of alumina, silica and titania and a titania functional coating over the undercoating layer. Examples 9-11 were made as follows: A glass float ribbon measuring 0.24 inches thick (0.6 cm thick) and at a temperature of approximately 1200° F. (649° C.) was passed under a chemical vapor deposition (CVD) coater having 2 slots positioned in the bath section of a float glass forming arrangement, i.e., the float glass ribbon is supported on molten tin. The precursors used to deposit the alumina-silica-titania coatings on the moving glass substrate were tetraethylorthosilicate (TEOS) for silica, aluminum tri-sec-butoxide (ATSB) for alumina, and titanium (IV) iso-propoxide (TPT) for titania. The precursors were evaporated at a temperature of 400° F. (204° C.) and the evaporated precursor gas phases were mixed at slot 1 and slot 2, respectively, at the volume percentage shown in Table 7. The total flow of the chemical vapor and carrier gas through each slot in the CVD coater was 85 standard cubic foot per minute (SCFM) (2407 standard liter per minute, slm). The line speed of the glass ribbon was approximately 190 inches (465 cm) per minute.

The float ribbon was then coated with titania using a second CVD coater using 3 slots (the coater has 7 slots). The precursor for titania was titanium(IV) isopropoxide (TPT). The total flow of the TPT vapor and carrier gas through each slot in the CVD top coater was 85 standard cubic foot per minute (SCFM) (2407 standard liter per minute, slm). The volume percentage of titanium(IV) iso-propoxide (TPT) was 0.2848% through each slot in the CVD top coater.

Example 12 was made in a manner similar to Examples 9-11 except only the titania functional coating was deposited directly on the float glass ribbon.

TABLE 7

Precursor Volume Percentages for the Undercoating layers of Examples 9-12

|  | Ex. 9 | Ex. 10 | Ex. 11 | Ex. 12 |
|---|---|---|---|---|
| Volume % of TEOS at Slot 1 | 0.290 | 0.428 | 0.319 | N/A |
| Volume % of TPT at Slot 1 | 0.073 | 0.064 | 0.080 | N/A |
| Volume % of ATSB at Slot 1 | 0.097 | 0.086 | 0.064 | N/A |
| Volume % of TEOS at Slot 2 | 0.299 | 0.302 | 0.246 | N/A |
| Volume % of TPT at Slot 2 | 0.150 | 0.181 | 0.147 | N/A |
| Volume % of ATSB at Slot 2 | 0.100 | 0.060 | 0.049 | N/A |

The amounts of alumina and titania as well as the thickness of the undercoating layers of Examples 9-12 are shown in Table 8 and were determined in the same manner as discussed earlier for Examples 1-3. The thickness of the titania topcoat was modeled using optical data with TFCalc® software. It should be noted that the titania concentration for Examples 9-11 includes the titania from the underlayer coating and functional coating. For Example 12, the titania determined by XRF is only from the functional coating.

TABLE 8

Coating Layer Composition and Thickness Data for Examples 9-12

|  | Ex. 9 | Ex. 10 | Ex. 11 | Ex. 12 |
|---|---|---|---|---|
| Alumina [micrograms/cm$^2$] | 0.98 | 1.07 | 0.64 | 0 |
| Titania [micrograms/cm$^2$] | 35.1 | 34.1 | 34.5 | 28.9 |
| Average volume % of titania in the undercoating layer | 33.2 | 27.1 | 30.0 | 0 |
| Average volume % of silica in the undercoating layer | 60.5 | 68.2 | 67.0 | 0 |
| Average volume % of alumina in the undercoating layer | 4.3 | 4.7 | 3.0 | 0 |
| Thickness of the undercoating layer [nm] | 63 | 64 | 59 | 0 |
| Thickness of the titania functional coating [nm] | 115 | 130 | 103 | 116 |

The reflected color performance of the coated side of Examples 9-12 was measured using a Lambda 9 spectrophotometer, commercially available from Perkin-Elmer Corporation (Norwalk, Conn.). The L*, a*, and b* values according to the CIE 1967 standard color coordinates for Examples 9-12 are shown in Table 9 below.

TABLE 9

Measured Color Performance of Examples 9-12

|  | Ex. 9 | Ex. 10 | Ex. 11 | Ex. 12 |
|---|---|---|---|---|
| a* | −9.53 | −6.65 | −3.40 | 7.73 |
| b* | −7.22 | −4.66 | −10.54 | −40.04 |
| L* | 48.39 | 52.79 | 45.57 | 44.39 |

The prepared examples were subjected to the stearic acid test as described above. The photocatalytic activity of the coated substrates of Examples 9-12 as calculated using the stearic acid test are shown in Table 10. For the purposes of the present invention, a PCA equal to or greater than $50 \times 10^{-3}$ $cm^{-1} min^{-1}$ is desirable.

TABLE 10

Results of the Stearic Acid Test for Examples 9-12

| | PCA ($\times 10^{-3}$ $cm^{-1}$ $min^{-1}$) |
|---|---|
| Ex. 9 | 57.0 |
| Ex. 10 | 58.2 |
| Ex. 11 | 60.4 |
| Ex. 12 | 25.4 |

Examples 13-16 represent models of thin film stacks on clear, glass substrates including an undercoating layer comprising a mixture of silica and zirconia and a titania coating over the undercoating layer. The underlayer is designed to be made up of two layers, a first layer that is >50% silica to give an amorphous material for better barrier properties, and a second layer that has a smaller amount of silica to give an higher index of refraction, thus grading the index of refraction from low to high through the thickness of the coating. The models are designed to give reflected color from the coated side within the limits of a* ranging from −10 to 0; b* ranging from −15 to 0; and L* ranging from 44 to 54. Table 11 contains information pertaining to the composition and thicknesses of the coating layers modeled in Examples 13-16.

TABLE 11

Coating Layer Composition and Thickness Data for Examples 13-16

|  | Ex. 13 | Ex. 14 | Ex. 15 | Ex. 16 |
|---|---|---|---|---|
| Thickness of first undercoating [nm] | 36.93 | 36.93 | 23.76 | 23.76 |
| Volume % Silica in first undercoating | 54.8 | 54.8 | 70.6 | 70.6 |
| Volume % Zirconia in first undercoating | 45.2 | 45.2 | 29.4 | 29.4 |
| Thickness of second undercoating [nm] | 40.29 | 40.29 | 56.61 | 56.61 |
| Volume % Silica in second undercoating | 10.3 | 10.3 | 20.0 | 20.0 |
| Volume % Zirconia in second undercoating | 89.7 | 89.7 | 80.0 | 80.0 |
| Thickness of titania coating [nm] | 76.00 | 110.00 | 95.00 | 118.00 |

L*, a*, and b* values of the reflected color from the coated side for Exs. 13-16 are shown in Table 12 below. The L*, a*, and b* values according to the CIE 1967 standard color coordinates were calculated from the thin film stack designs using TFCalc® software.

TABLE 12

Modeled Color Performance of Examples 13-16

|  | Ex. 13 | Ex. 14 | Ex. 15 | Ex. 16 |
|---|---|---|---|---|
| a* | −0.61 | −2.4 | −5.1 | −1.1 |
| b* | −1.3 | −8.6 | −2.1 | −1.5 |
| L* | 51.76 | 52.23 | 51.41 | 54.04 |

CONCLUSION

The examples above show that the undercoating layers of the present invention improve the photocatalytic performance (PCA) as measured by the stearic acid test of coated substrates. Examples 1-3 demonstrate the effect of an undercoating layer comprising a mixture of alumina and silica. With the undercoating layer, the coated substrates exhibit a PCA in excess of $87 \times 10^{-3}$ $cm^{-1} min^{-1}$. Without the undercoating layer, the substrate exhibits a PCA of $43 \times 10^{-3}$ $cm^{-1} min^{-1}$. Similarly, Examples 5-8 having undercoating layers comprising a mixture of silica and zirconia exhibit higher levels of PCA than is the case without an undercoating layer (Ex. 4). Examples 9-11 exhibit the same phenomenon for undercoating layers comprising a mixture of alumina, silica and titania.

In certain embodiments, it will be necessary for the coated substrate to meet the following reflected color specification as measured from the coated side: a* ranging from −20 to 20; b* ranging from −20 to 20; and L* ranging from 40 to 60. Examples 9-11 show that coatings according to the present invention can be the required color specification.

Examples 13-16 show that a coated substrate have an undercoating layer made up of multiple films of silica and zirconia can be designed that meet the desired color specification.

It will be readily appreciated by those skilled in the art that modifications may be made to the invention without departing from the concepts disclosed in the foregoing description. Such modifications are to be considered as included within the scope of the invention. Accordingly, the particular embodiments described in detail hereinabove are illustrative only and are not limiting as to the scope of the invention, which is to be given the full breadth of the appended claims and any and all equivalents thereof.

We claim:

1. A coated substrate comprising:
   a glass substrate;
   at least one undercoating layer consisting essentially of a mixture of silica and alumina or a mixture of silica and zirconia, wherein the undercoating layer is selected from the group consisting of:
   (a) a mixture of silica and alumina having a molar ratio of about 4 moles of silica to about 1 mole of alumina; and
   (b) a mixture of silica and zirconia having a molar ratio of about 8 to about 20 moles of silica to about 1 mole of zirconia; and
   a photocatalytic functional coating overlaying at least a portion of the undercoating layer, wherein the photocatalytic functional coating comprises titania, and wherein the coated substrate with the undercoating layer has a higher photocatalytic activity than without the undercoating layer.

2. The coated substrate according to claim 1, wherein the undercoating layer has a thickness ranging from 1 nm to 300 nm.

3. The coated substrate according to claim 1, wherein the undercoating layer consists essentially of the mixture of silica and alumina.

4. The coated substrate according to claim 3, wherein the undercoating layer has a thickness of about 104 nm to about 337 nm.

5. The coated substrate according to claim 1, wherein the substrate is a glass ribbon.

6. The coated substrate according to claim 1, wherein the coated substrate exhibits the following reflected color coordinates according to the CIE 1967 as measured from the coated side: a* ranging from −20 to 20; b* ranging from −20 to 20; and L* ranging from 40 to 60.

7. The coated substrate according to claim 1, wherein the undercoating layer has a thickness of about 20 nm to about 73 nm.

8. The coated substrate according to claim 1, wherein the undercoating layer consists essentially of the mixture of silica and zirconia.

9. A coated substrate comprising:
a glass substrate;
a first undercoating layer overlaying at least a portion of the substrate, the first undercoating layer comprising a first mixture of about 54.8 to about 70.6 volume % of silica and about 29.4 to about 45.2 volume % of zirconia;
a second undercoating layer overlaying at least a portion of the first undercoating layer, the second undercoating layer comprising a second mixture of about 10.3 to about 20.0 volume % of silica and about 80.0 to about 89.7 volume % of zirconia; and
a photocatalytic functional coating overlaying at least a portion of the undercoating layer, wherein the photocatalytic functional coating comprises titania.

10. The coated substrate according to claim 9, wherein the first undercoating layer has a thickness of about 23.76 nm to about 36.93 nm.

11. The coated substrate according to claim 9, wherein the second undercoating layer has a thickness of about 40.29 nm to about 56.61 nm.

12. The coated substrate according to claim 9, wherein the photocatalytic functional coating has a thickness of about 76 nm to about 118 nm.

13. The coated substrate according to claim 9, wherein the substrate is a glass ribbon.

14. The coated substrate according to claim 9, wherein the coated substrate exhibits the following reflected color coordinates according to the CIE 1967 as measured from the coated side: a* ranging from −20 to 20; b* ranging from −20 to 20; and L* ranging from 40 to 60.

* * * * *